(12) United States Patent
Takahashi et al.

(10) Patent No.: US 9,540,743 B2
(45) Date of Patent: Jan. 10, 2017

(54) AMORPHOUS SILICON CRYSTALLIZING METHOD, CRYSTALLIZED SILICON FILM FORMING METHOD, SEMICONDUCTOR DEVICE MANUFACTURING METHOD AND FILM FORMING APPARATUS

(71) Applicant: TOKYO ELECTRON LIMITED, Tokyo (JP)

(72) Inventors: Kazuya Takahashi, Nirasaki (JP); Yoshikazu Furusawa, Nirasaki (JP); Mitsuhiro Okada, Nirasaki (JP); Hiromasa Yonekura, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/566,069

(22) Filed: Dec. 10, 2014

(65) Prior Publication Data

US 2015/0159295 A1 Jun. 11, 2015

(30) Foreign Application Priority Data

Dec. 11, 2013 (JP) ................................. 2013-255894

(51) Int. Cl.
| | | |
|---|---|---|
| H01L 21/00 | (2006.01) | |
| H01L 21/322 | (2006.01) | |
| C30B 5/00 | (2006.01) | |
| C30B 1/02 | (2006.01) | |
| C30B 29/54 | (2006.01) | |
| C30B 29/06 | (2006.01) | |

(52) U.S. Cl.
CPC ............... *C30B 1/023* (2013.01); *C30B 29/06* (2013.01); *C30B 29/54* (2013.01); *Y10T 117/10* (2015.01)

(58) Field of Classification Search
CPC .................................. C30B 1/023; C30B 29/54
USPC ....................................... 438/151; 117/8, 200
See application file for complete search history.

(56) References Cited

U.S. PATENT DOCUMENTS

| | | | | |
|---|---|---|---|---|
| 6,093,243 A | * | 7/2000 | Okada | ................. H01L 21/2022 117/8 |
| 7,238,613 B2 | * | 7/2007 | Ping | .................... H01L 21/2022 257/E21.013 |
| 2005/0227459 A1 | * | 10/2005 | Takahashi | ............... C23C 16/24 438/486 |
| 2013/0037806 A1 | * | 2/2013 | Hayashi | ............ H01L 29/78669 257/57 |
| 2013/0109197 A1 | * | 5/2013 | Murakami | ........ H01L 21/32105 438/770 |

FOREIGN PATENT DOCUMENTS

| | | |
|---|---|---|
| JP | 63-029954 A | 2/1988 |
| JP | 02-028315 A | 1/1990 |
| JP | 03-109299 A | 5/1991 |

(Continued)

*Primary Examiner* — Long K Tran
(74) *Attorney, Agent, or Firm* — Nath, Goldberg & Meyer; Jerald L. Meyer

(57) ABSTRACT

There is provided a method of crystallizing amorphous silicones, which includes: forming a stacked structure of a second amorphous silicon film followed by a first amorphous silicon film on an underlay film, the second amorphous silicon film having a faster crystal growth rate than the first amorphous silicon film; and performing a crystallization treatment on the stacked structure to crystallize silicones contained in at least the second amorphous silicon film.

8 Claims, 11 Drawing Sheets

(56) References Cited

FOREIGN PATENT DOCUMENTS

| JP | 04-124814 A | 4/1992 |
| JP | 05-109638 A | 4/1993 |
| JP | 08-264440 A | 10/1996 |

* cited by examiner

AMORPHOUS SILICON CRYSTALLIZING METHOD, CRYSTALLIZED SILICON FILM FORMING METHOD, SEMICONDUCTOR DEVICE MANUFACTURING METHOD AND FILM FORMING APPARATUS

CROSS-REFERENCE TO RELATED APPLICATION

This application claims the benefit of Japanese Patent Application No. 2013-255894, filed on Dec. 11, 2013, in the Japan Patent Office, the disclosure of which is incorporated herein in its entirety by reference.

TECHNICAL FIELD

The present disclosure relates to an amorphous silicon crystallizing method, a crystallized silicon film forming method, a semiconductor device manufacturing method, and a film forming apparatus.

BACKGROUND

A crystallized silicon film obtained by crystallizing amorphous silicones is used as a channel of a thin film transistor (TFT) for driving pixels of a flat panel display (FPD), a channel of a memory cell transistor of a non-volatile semiconductor memory, or the like.

The reason why the amorphous silicones are crystallized is to improve carrier mobility. The carrier mobility increases in order of amorphous silicon→polycrystalline silicon→single crystalline silicon. As such, in a film forming process, silicones of a silicon film being in an amorphous state is first crystallized to use as the channel of the transistor, for example. There are known various methods of crystallizing the amorphous silicones.

A first conventional method includes depositing amorphous silicones on an insulating film in two stages. At this time, a deposition temperature in the first stage is set to be higher than that in the second stage. Further, a hydrogen doping process is performed in the first stage. This suppresses an increase in density of crystal seeds so that an SOI (silicon-on-insulator) substrate having large grain size is manufactured.

A second conventional method includes forming a stacked structure of a non-doped amorphous silicon film followed by a phosphorus (P)-doped amorphous silicon film on a substrate, and heating the stacked structure at 600 degrees C. This method is based on the fact that a grain size increases with increases in the doping amount of the phosphorus. Initially, amorphous silicones of the phosphorus-doped amorphous silicon film are crystallized and subsequently, amorphous silicones of the non-doped amorphous silicon film are crystallized using the crystallized amorphous silicones as crystal seeds. Thus, a polycrystalline silicon film having large grain size is obtained.

However, the first conventional method requires switching the deposition temperature in the deposition of the amorphous silicones. To do this, a period of time is required to increase or decrease the temperature, which results in a degradation of productivity.

Further, in the second conventional method, a phosphorus (P) doping process is performed. Phosphorus is a chemical element of V group and serves to change a chemical element of IV group into an N-type semiconductor. When the doping amount of phosphorus is increased to increase a grain size, an N-type polycrystalline silicon film is obtained. If the N-type polycrystalline silicon film is used as the channel of the transistor, only a P-channel transistor is formed. To obtain an N-channel transistor requires changing the N-type polycrystalline silicon film into a P-type polycrystalline silicon film. In order to change the N-type polycrystalline silicon film, in which a large amount of phosphorus is diffused, into the P-type polycrystalline silicon film, it is necessary to introduce a large amount of a chemical element of III group. However, such an introduction is not practical in terms of productivity. In addition, the introduction may cause a crystal defect.

SUMMARY

Some embodiments of the present disclosure provide an amorphous silicon crystallizing method and a crystallized silicon film forming method, which are capable of obtaining single crystalline regions having large grain size without degrading productivity, a semiconductor device manufacturing method using the film forming method, and a film forming apparatus configured to perform the film forming method.

According to one embodiment of the present disclosure, there is provided a method of crystallizing amorphous silicones, including: forming a stacked structure of a second amorphous silicon film followed by a first amorphous silicon film on an underlay film, the second amorphous silicon film having a faster crystal growth rate than the first amorphous silicon film; and performing a crystallization treatment on the stacked structure to crystallize silicones contained in at least the second amorphous silicon film.

According to another embodiment of the present disclosure, there is provided a method of forming a crystallized silicon film by crystallization of amorphous silicones, including: supplying a silicon raw material gas and a gas containing an impurity for suppressing the crystallization of the amorphous silicones onto a surface to be processed of an object to be processed; supplying only the silicon raw material gas onto the surface to be processed; and performing a crystallization treatment on amorphous silicon films formed on the surface to be processed to crystallize the amorphous silicones contained in the amorphous silicon films.

According to another embodiment of the present disclosure, there is provided a method of forming a crystallized silicon film by crystallization of amorphous silicones, including: supplying a silicon raw material gas including an organic silicon compound onto a surface to be processed of an object to be processed; supplying another silicon raw material gas excluding the organic silicon compound onto the surface to be processed; and performing a crystallization treatment on amorphous silicon films formed on the surface to be processed to crystallize amorphous silicones contained in the amorphous silicon films.

According to another embodiment of the present disclosure, there is provided a method of manufacturing a semiconductor device using a crystallized silicon film obtained by crystallization of amorphous silicones, the method including: forming the crystallized silicon film using the aforementioned crystallized silicon film forming method.

According to another embodiment of the present disclosure, there is provided a film forming apparatus, including: a processing chamber receiving an object to be processed; a process gas supply mechanism configured to supply a process gas into the processing chamber; a heating mechanism configured to heat the object to be processed received in the processing chamber; an exhaust mechanism configured to exhaust the processing chamber; and a control unit configured to control the process gas supply mechanism, the heating mechanism and the exhaust mechanism. The controller controls the process gas supply mechanism, the heating mechanism and the exhaust mechanism so as to perform the aforementioned crystallized silicon film forming method such that a crystallized silicon film is formed on a surface to be processed of the object to be processed.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Figure 1:
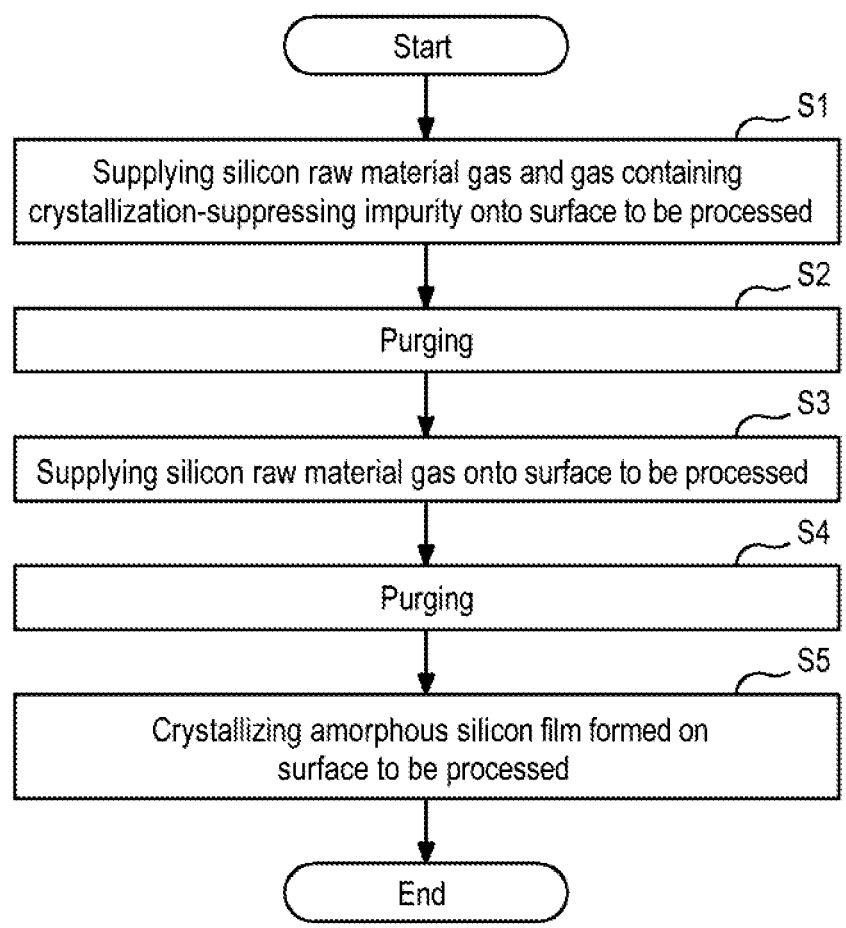
FIG. 1 is a flowchart showing an example of a crystallized silicon film forming method according to a first embodiment of the present disclosure.

Reference will now be made in detail to various embodiments, examples of which are illustrated in the accompanying drawings. Like components will be denoted by like reference numerals throughout the specification. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

First Embodiment

<Crystallized Silicon Film Forming Method and Amorphous Silicon Crystallizing Method>

Figure 2A:
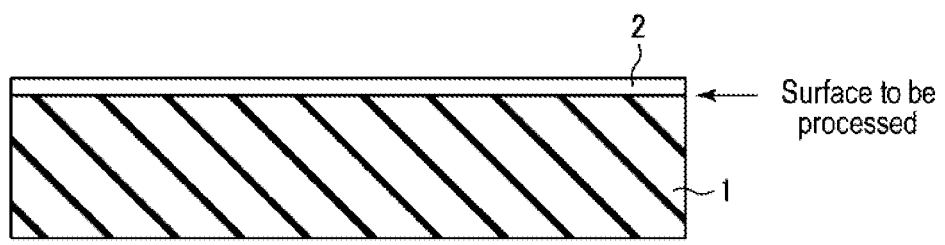
FIGS. 2A to 2C are sectional views showing major steps of the example of the crystallized silicon film forming method according to the first embodiment of the present disclosure.
Figure 2B:
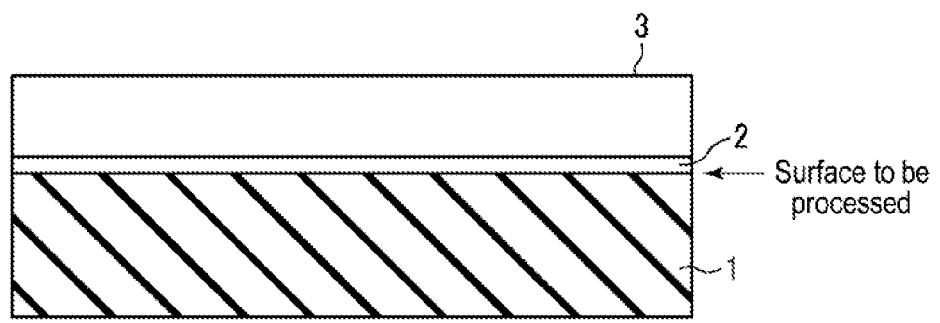
Figure 2C:
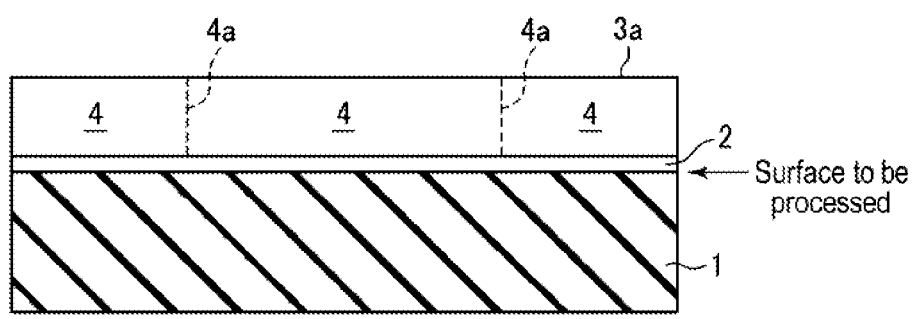

FIG. 1 is a flowchart showing an example of a crystallized silicon film forming method according to a first embodiment of the present disclosure, and FIGS. 2A to 2C are sectional views showing major steps of the film forming method.

First, an object to be processed (e.g., silicon substrate) is prepared. As shown in FIG. 2A, a silicon oxide film 1 as an insulating film is formed on a surface to be processed of the silicon substrate. A crystallized silicon film (which will be described later) is formed on the silicon oxide film 1.

Thereafter, the silicon substrate on which the silicon oxide film 1 is formed is loaded into a processing chamber of a film forming apparatus. Subsequently, as shown in Step S1 in FIG. 1, a silicon raw material gas and an impurity-containing gas for suppressing the progress of crystallization are supplied onto a surface to be processed of the silicon oxide film 1. Thus, as shown in FIG. 2A, an impurity-doped amorphous silicon film 2 is formed on the surface to be processed of the silicon oxide film 1. Examples of the impurity may include carbon (C), oxygen (O), nitrogen (N), and the like. In this embodiment, carbon is used as the impurity. An ethylene ($C_2H_4$) gas is used as the carbon-containing gas, and a monosilane ($SiH_4$) gas is used as the silicon raw material gas.

An example of processing conditions in Step S1 is as follows:
Flow rate of monosilane: 500 sccm
Flow rate of ethylene: 50 sccm
Processing time: 160 sec
Processing temperature: 530 degrees C.
Processing pressure: 53.2 Pa (0.4 Torr) (wherein, 1 Torr is defined as 133 Pa).

Under the above conditions, the amorphous silicon film 2 doped with carbon (hereinafter, sometimes referred to as a "carbon-doped amorphous silicon film 2") having a thickness of about 2 nm is formed on the silicon oxide film 1. In this embodiment, a concentration of carbon contained in the carbon-doped amorphous silicon film 2 is about $1 \times 10^{21}$ $cm^{-3}$.

Subsequently, as shown in Step S2 in FIG. 1, an inert gas is supplied into the processing chamber while exhausting the processing chamber such that the interior of the processing chamber is purged. Examples of the inert gas may include a nitrogen gas ($N_2$), a noble gas such as an argon gas (Ar), or the like. This Step S2 may be omitted, if necessary.

Thereafter, as shown in Step S3 in FIG. 1, the silicon raw material gas is supplied onto the carbon-doped amorphous silicon film 2 without supplying the carbon-containing gas. Thus, as shown in FIG. 2B, a non-doped amorphous silicon film 3 is formed on the carbon-doped amorphous silicon film 2.

An example of processing conditions in Step S3 is as follows:
Flow rate of monosilane flow rate: 500 sccm
Processing time: 1200 sec
Processing temperature: 530 degrees C.
Processing pressure: 53.2 Pa (0.4 Torr).

Under the above conditions, the non-doped amorphous silicon film 3 having a thickness of about 30 nm is formed on the carbon-doped amorphous silicon film 2.

Thereafter, as shown in Step S4 in FIG. 1, an inert gas is supplied into the processing chamber while exhausting the processing chamber such that the interior of the processing chamber is purged.

Subsequently, the silicon substrate configured as above is subjected to a crystallization treatment inside the processing chamber of the film forming apparatus. In some embodiments, the silicon substrate may be unloaded from the processing chamber of the film forming apparatus and be loaded into another processing chamber of a heat treatment apparatus where the silicon substrate is subjected to the crystallization treatment. An example of the crystallization treatment is annealing By this annealing, as shown in Step S5 in FIG. 1 and in FIG. 2C, at least the non-doped amorphous silicon film 3 formed on the surface to be processed is crystallized.

An example of processing conditions in Step S5 is as follows:

Annealing atmosphere: $N_2$, $H_2$, Ar, or the like
Processing time: 600 min
Processing temperature: 550 degrees C.
Processing pressure: 1013 hPa (760 Torr; normal pressure).

Under the above conditions, the non-doped amorphous silicon film 3 is modified into a crystallized silicon film 3a in which single crystalline regions 4 having a relatively large size are formed. In addition, in FIG. 2C, reference numerals 4a schematically denote crystal grain boundaries between the single crystalline regions 4.

As described above, the crystallized silicon film forming method according to the first embodiment forms the carbon-doped amorphous silicon film 2, followed by forming the non-doped amorphous silicon film 3, which makes it possible to obtain the crystallized silicon film 3a having the large-sized single crystalline regions 4. Hereinafter, in this regard, a detailed description will be given.

<Relationship between Crystallization Annealing Time and Crystallization Rate>

Figure 3:
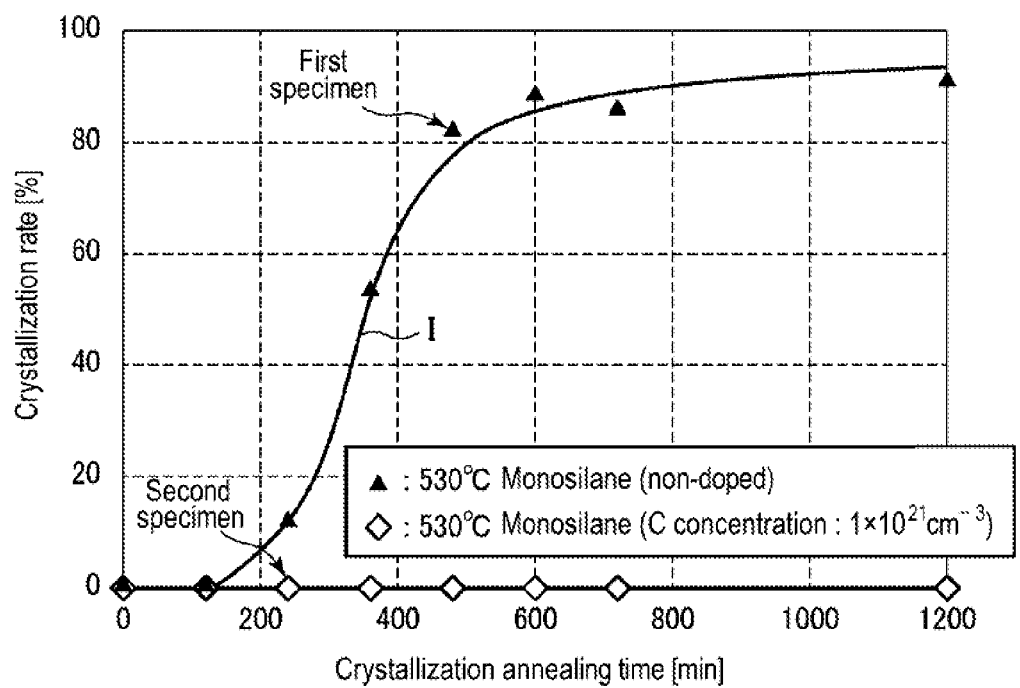
FIG. 3 is a graph showing a relationship between a crystallization annealing time and a crystallization rate.

FIG. 3 is a graph showing a relationship between a crystallization annealing time and a crystallization rate.

Figure 4A:
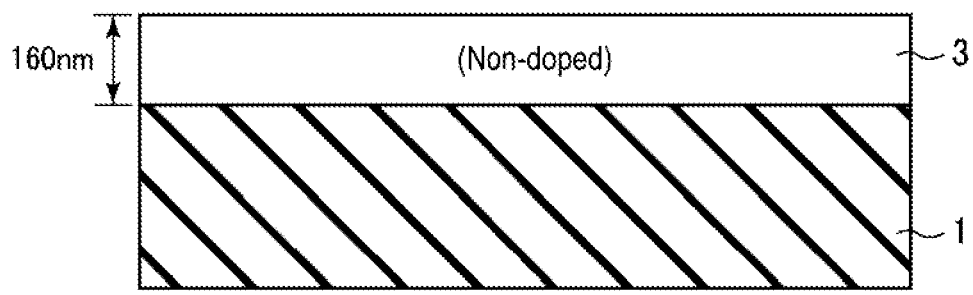
FIG. 4A is a sectional view of a first specimen.

As indicated by a curve I in FIG. 3, when the crystallization annealing is performed at a temperature of 550 degrees C. in an inert gas atmosphere, on the non-doped amorphous silicon film 3 of 160 nm thickness, which is directly formed on the silicon oxide film 1 (first specimen; see FIG. 4A), the non-doped amorphous silicon film 3 began a crystal growth at about 240 min (4 hours). Thereafter, a crystallization rate of the non-doped amorphous silicon film 3 was increased with an increase in the crystallization annealing time such as 360 min (6 hours), 480 min (8 hours), and 600 min (10 hours).

Figure 4B:
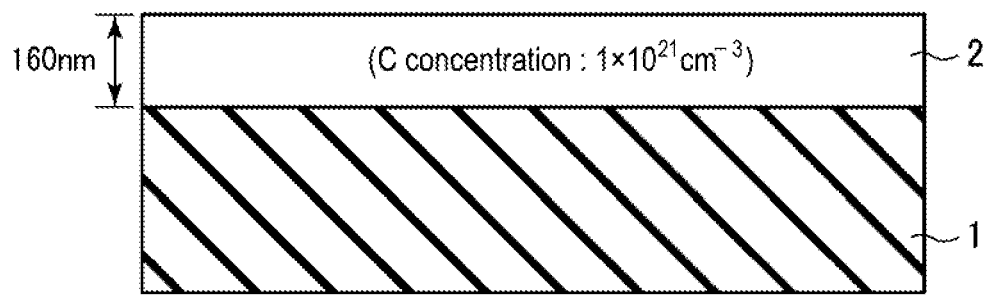
FIG. 4B is a sectional view of a second specimen.

On the other hand, even though the crystallization annealing is performed at the temperature of 550 degrees C. in the inert gas atmosphere, on the carbon-doped amorphous silicon film 2 of 160 nm thickness, which is formed on the silicon oxide film 1 (second specimen; see FIG. 4B), the crystal growth did not occur. This crystal growth did not occur even after a lapse of 1200 min (20 hours).

Specifically, the carbon-doped amorphous silicon film 2 manifests slower crystal growth than the non-doped amorphous silicon film 3. The crystallization occurs by generating crystal seeds in an amorphous film, followed by crystal-growing the crystal seeds therein. Fast crystal growth means that it is easy to generate the crystal seeds in the amorphous film.

The crystal seeds are prone to be concentrated in a special portion in the amorphous film rather than being randomly generated in the amorphous film. In the amorphous film, the special portion may be an interfacial zone with an underlay film.

Figure 5A:
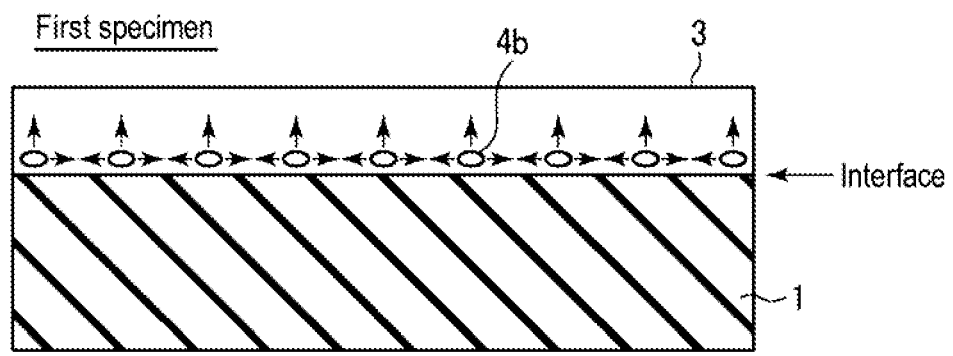
FIG. 5A is a schematic sectional view showing a state where crystal seeds are generated in the first specimen.
Figure 5B:
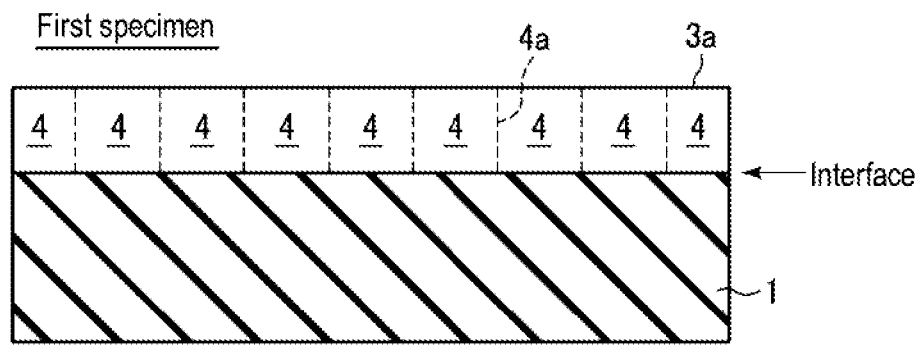
FIG. 5B is a schematic sectional view showing a crystallization state in the first specimen.

FIG. 5A is a schematic sectional view showing a state where crystal seeds 4b are generated in the first specimen, and FIG. 5B is a schematic sectional view showing a crystallization state in the first specimen.

As shown in FIG. 5A, in the first specimen, the crystal seeds 4b are generated in an interfacial zone facing the silicon oxide film 1 (used as the underlay film) in the non-doped amorphous silicon film 3. Since the non-doped amorphous silicon film 3 undergoes fast crystal growth, the crystal seeds 4b are generated in high density. The crystal seeds 4b grow with the crystallization annealing so that they grow in the respective single crystalline regions 4 as shown in FIG. 5B. In the first specimen, since the crystal seeds 4b are generated in high density, a size (grain size) of each of the single crystalline regions 4 formed in the crystallized silicon film 3a is small.

Figure 6A:
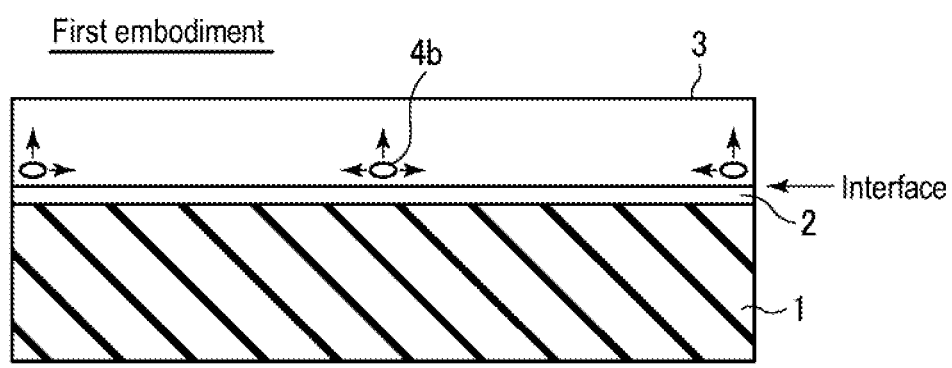
FIG. 6A is a schematic sectional view showing a state where crystal seeds are generated in the first embodiment.
Figure 6B:
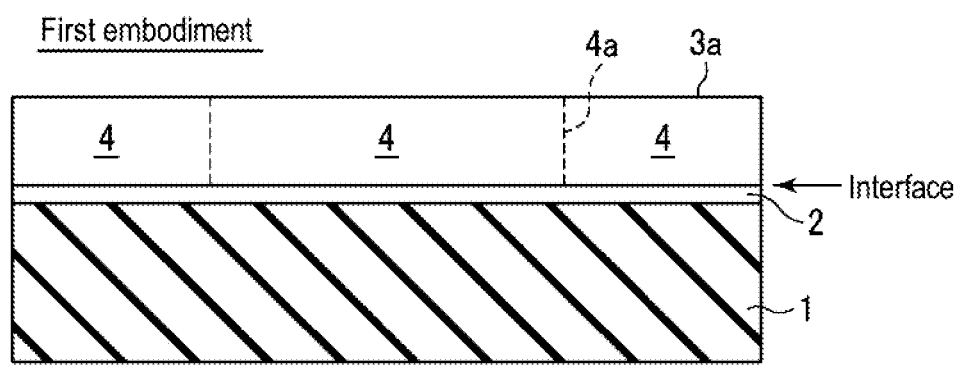
FIG. 6B is a schematic sectional view showing a crystallization state in the first embodiment.

FIG. 6A is a schematic sectional view showing a state where the crystal seeds 4b are generated in the first embodiment, and FIG. 6B is a schematic sectional view showing a crystallization state in the first embodiment.

As shown in FIG. 6A, in the first embodiment, the crystal seeds 4b are generated in an interfacial zone facing the carbon-doped amorphous silicon film 2 in the non-doped amorphous silicon film 3. In addition, crystal seeds in the carbon-doped amorphous silicon film 2 are formed to be slower than the non-doped amorphous silicon film 3. As such, at a point of time at which the crystal seeds 4b start to be generated in the non-doped amorphous silicon film 3, the crystal seeds are not generated in the carbon-doped amorphous silicon film 2.

In addition, in the first embodiment, a density of the crystal seeds 4b generated in the non-doped amorphous silicon film 3 is lower than that in the first specimen due to influence of the carbon-doped amorphous silicon film 2 in which the crystal growth occurs slowly, that is, it is difficult to generate the crystal seeds. This makes a size (grain size) of each of the single crystalline regions 4 formed in the crystallized silicon film 3a larger compared with the first specimen.

As described above, according to the first embodiment, the non-doped amorphous silicon film 3 which manifests a relatively fast crystal growth is stacked on the carbon-doped amorphous silicon film 2 which manifests a relatively slow crystal growth. This configuration reduces the density of the crystal seeds 4b which are generated in an interfacial zone facing the carbon-doped amorphous silicon film 2 in the non-doped amorphous silicon film 3.

According to the first embodiment in which the density of the crystal seeds 4b can be reduced, it is possible to increase the size of each of the single crystalline regions 4 (in which the crystal seeds 4b are grown) in the non-doped amorphous silicon film 3, that is, a size of respective polycrystalline grains grown in the single crystalline regions 4. This improves a carrier mobility in a semiconductor device using the non-doped amorphous silicon film 3 as a channel.

In some embodiments, both the carbon-doped amorphous silicon film 2 and the non-doped amorphous silicon film 3 may be formed at the same temperature, thus avoiding a degradation of productivity.

Further, the carbon-doped amorphous silicon film 2 is provided to reduce the density of the crystal seeds 4b in the non-doped amorphous silicon film 3. As such, the carbon-doped amorphous silicon film 2 may have a thin thickness. Accordingly, the carbon-doped amorphous silicon film 2 can be formed in a short period of time. This makes it possible to form the carbon-doped amorphous silicon film 2 without invoking a significant degradation of productivity. Since the carbon-doped amorphous silicon film 2 is provided to reduce the density of the crystal seeds 4b in the non-doped amorphous silicon film 3, in some embodiments, a thickness of the carbon-doped amorphous silicon film 2 may be set to a thickness sufficient to permit carbons to be doped, rather than that sufficient to permit silicones to be adsorbed onto the silicon oxide film 1. Alternatively, the thickness of the carbon-doped amorphous silicon film 2 may be set to a thickness sufficient to permit the density of the crystal seeds 4b in the non-doped amorphous silicon film 3 to be reduced.

In general, carbon is not an element determining a conductive type of a semiconductor. Thus, it is possible to easily determine whether a conductive type of the non-doped amorphous silicon film 3 is set to be an N-type or a P-type. As an example, it is possible to easily introduce a chemical element of III group or IV group into the non-doped amorphous silicon film 3.

The amorphous silicon crystallizing method and the crystallized silicon film forming method, which are configured as above, may be effectively employed in a semiconductor device manufacturing apparatus using a crystallized silicon film obtained by crystallizing amorphous silicones and an FPD apparatus in which TFTs for driving pixels are integrated. Examples of the semiconductor device manufacturing apparatus may include a semiconductor integrated circuit device having an SOI structure, a semiconductor integrated circuit device in which transistors having channels formed in a height direction are integrated, or the like.

Therefore, according to the first embodiment, it is possible to provide the amorphous silicon crystallizing method and the crystallized silicon film forming method, which are capable of obtaining single crystalline regions having large grain size without degrading productivity, and the semiconductor device manufacturing apparatus.

<Dependence of Crystallization Rate on Carbon Concentration>

An investigation was performed to check a relationship between a crystallization rate and a carbon concentration by changing a concentration of carbon contained in the carbon-doped amorphous silicon film 2.

Figure 7:
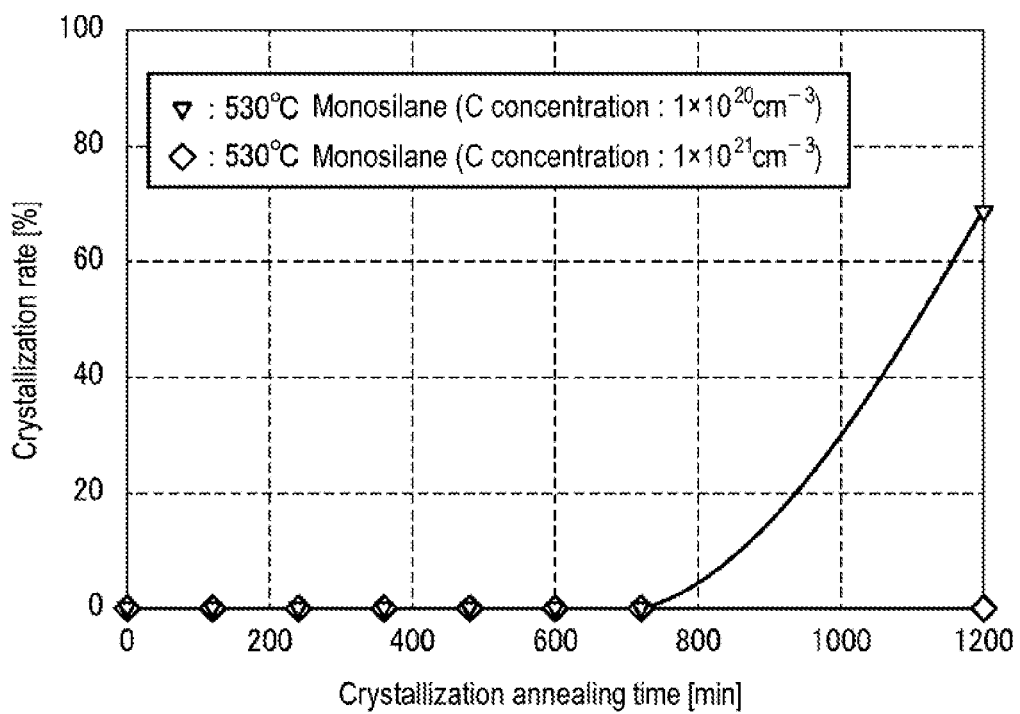
FIG. 7 is a graph showing dependence of a crystallization rate on a carbon concentration.

FIG. 7 is a graph showing dependence of the crystallization rate on the carbon concentration.

In an investigation shown in FIG. 7, as described in the first embodiment, when the concentration of carbon contained in the carbon-doped amorphous silicon film 2 is set to $1\times10^{21}$ cm$^{-3}$, the crystal growth of the carbon-doped amorphous silicon film 2 was not observed even after the crystallization annealing (in an inert gas atmosphere at 550 degrees C.) is performed for 1200 min (see a symbol ◇ in FIG. 7). In view of this point, the crystallization annealing (in the inert gas atmosphere at 550 degrees C.) was performed for 1200 min in the same manner in a condition where the concentration of carbon contained in the carbon-doped amorphous silicon film 2 is reduced by 1/1000 to be changed to $1\times10^{20}$ cm$^{-3}$.

As shown in FIG. 7, the investigation has shown that, when the concentration of carbon contained in the carbon-doped amorphous silicon film 2 is set to $1\times10^{20}$ cm$^{-3}$, a crystal growth corresponding to a crystallization rate of about 70% by the crystallization annealing (under the conditions: the inert gas atmosphere, 550 degrees C., and 1200 minutes) is manifested (see a symbol ∇ in FIG. 7). It should be noted that, although the carbon-doped amorphous silicon film 2 has been described as undergoing a relatively slow crystal growth, it does not mean that the carbon-doped amorphous silicon film 2 does not undergo crystallization. In addition, it may be assumed that, if the carbon-doped amorphous silicon film 2 is similar to the non-doped amorphous silicon film 3 by decreasing the concentration of carbon contained in the carbon-doped amorphous silicon film 2, a rate of the crystal growth of the carbon-doped amorphous silicon film 2 becomes close to that of the non-doped amorphous silicon film 3. Accordingly, by using such a property of the carbon-doped amorphous silicon film 2, it is possible to form a crystallized silicon film from the carbon-doped amorphous silicon film 2 in addition to the non-doped amorphous silicon film 3. Hereinafter, such an example will be described as a first modified example.

First Modified Example

Figure 8:
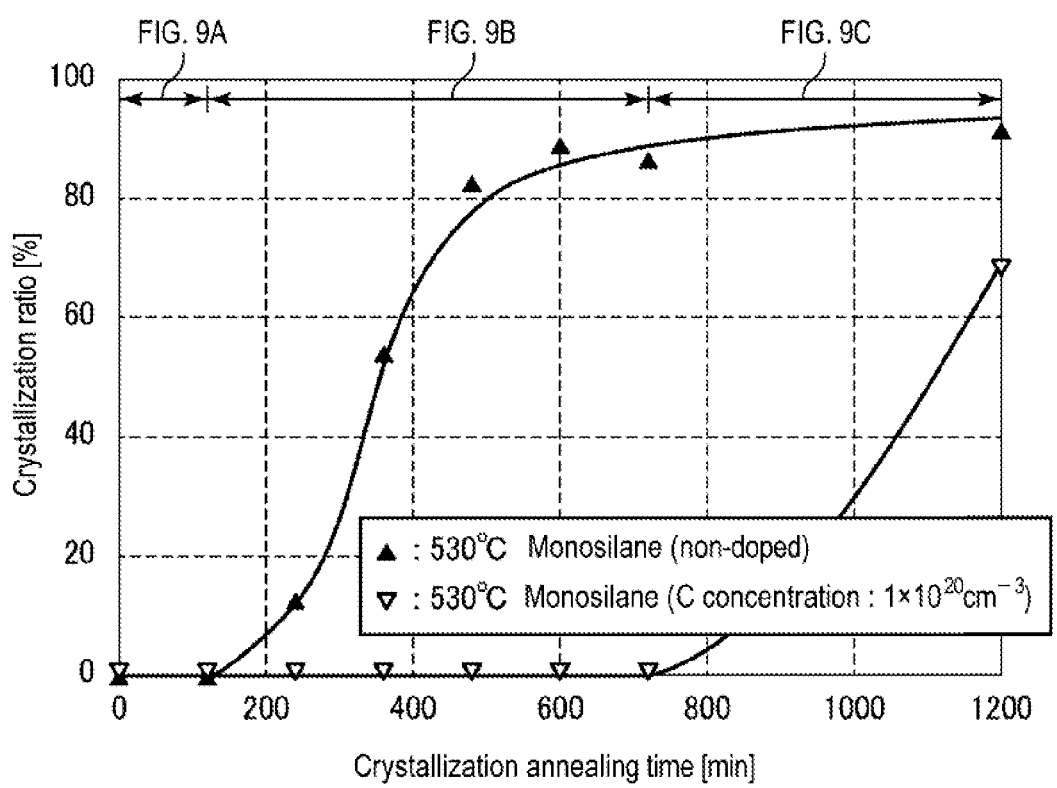
FIG. 8 is a graph showing a relationship between a crystallization annealing time and a crystallization rate in a first modified example.
Figure 9A:
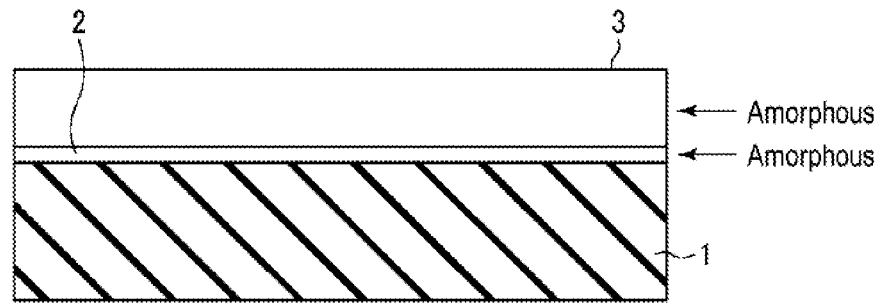
FIGS. 9A to 9C are sectional views showing crystallization states in the first modified example.
Figure 9B:
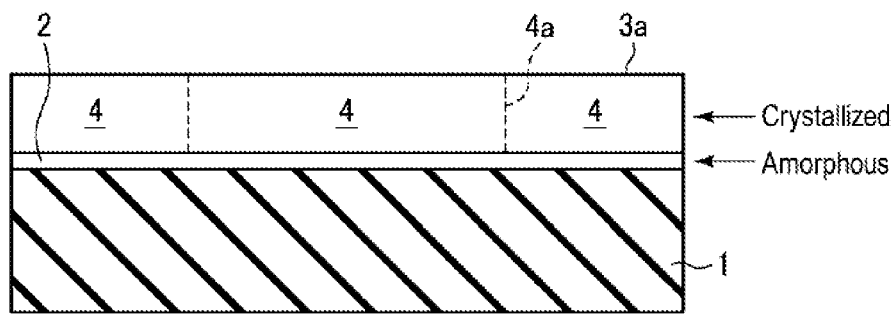
Figure 9C:
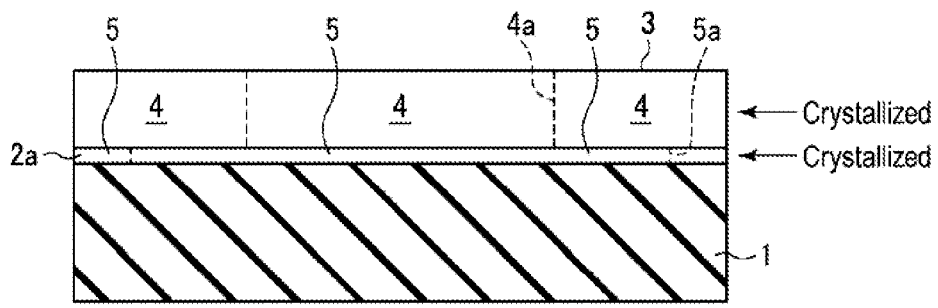

FIG. 8 is a graph showing a relationship between a crystallization annealing time and a crystallization rate in a first modified example. FIGS. 9A to 9C are sectional views showing a crystallization state in the first modified example.

As described in a Note box of FIG. 8, in the first modified example, a concentration of carbon contained in the carbon-doped amorphous silicon film 2 is set to $1\times10^{20}$ cm$^{-3}$. The carbon-doped amorphous silicon film 2 may be formed under, e.g., the following processing conditions:

Flow rate of monosilane: 500 sccm
Flow rate of ethylene: 5 sccm
Processing time: 140 sec
Processing temperature: 530 degrees C.
Processing pressure: 53.2 Pa (0.4 Torr).

In the first modified example, the non-doped amorphous silicon film 3 may be formed under the processing conditions in step S3 described in the first embodiment. Upon the formation of the non-doped amorphous silicon film 3, a crystallization treatment (e.g., the crystallization annealing) is performed. This crystallization annealing may be performed under the same processing conditions including the annealing atmosphere, the processing temperature and the processing pressure, which are described in Step S5 in the first embodiment, except for the processing time.

As shown in FIGS. 8 and 9A, for the crystallization annealing time of 0 to 120 min (0 to 2 hours), both the carbon-doped amorphous silicon film 2 and the non-doped amorphous silicon film 3 do not undergo a crystal growth and thus, are in an amorphous state.

Thereafter, as shown in FIGS. 8 and 9B, when the crystallization annealing time exceeds 120 minutes, the non-doped amorphous silicon film 3 begins to undergo the crystal growth so that silicones contained in the non-doped amorphous silicon film 3 are crystallized.

Further, as shown in FIGS. 8 and 9C, after a time lapse of, e.g., 720 min (12 hours), the carbon-doped amorphous silicon film 2 also initiates to undergo the crystal growth so that silicones contained in the carbon-doped amorphous silicon film 2 are crystallized, thereby obtaining a crystallized carbon-doped silicon film 2a. For example, when the crystallization annealing is performed for 1200 min (20 hours) or longer, about 70% or more of the carbon-doped amorphous silicon film 2 can be crystallized. In FIG. 9C, reference numerals 5 denote single crystalline regions formed in the crystallized carbon-doped silicon film 2a, and reference numeral 5a denotes a grain boundary defined between the single crystalline regions 5.

According to the first modified example, both the non-doped amorphous silicon film 3 and the carbon-doped amorphous silicon film 2 can be crystallized. This configuration substantially removes amorphous portions from the amorphous silicon films 2 and 3 formed on the silicon oxide film 1, thus forming almost complete crystallized silicon films.

As described above, the almost complete crystallized silicon films can be formed on, for example, the silicon oxide film 1. Accordingly, the use of the almost complete crystallized silicon films as channels of transistors makes it possible to suppress a carrier mobility from being degraded by the amorphous portions.

As described above, the carbon-doped amorphous silicon film 2, which is formed to reduce the density of the crystal seeds 4b in the non-doped amorphous silicon film 3, can also be crystallized.

In the first modified example, the carbon-doped amorphous silicon film 2 may be crystallized by the crystallization treatment (e.g., the crystallization annealing) as in the first embodiment. Alternatively, in a case where the crystallization treatment is stopped after, e.g., 600 minutes (10 hours), the carbon-doped amorphous silicon film 2 may be subjected to the crystallization treatment using a thermal history in a manufacturing process which is performed after the non-doped amorphous silicon film 3 is crystallized. Examples of the manufacturing process may include: forming a conductive film for forming a gate electrode or an internal wiring layer; performing an activation annealing on an impurity to determine a conductive type of a semiconductor; and forming an interlayer insulating film. This configuration eliminates a need to prolong a duration of the crystallization treatment (e.g., the crystallization annealing) in order to crystallize the carbon-doped amorphous silicon film 2, thus improving productivity.

Second Modified Example

While in the first embodiment and the first modified example, the carbon (C) has been described to be used as the crystallization-suppressing impurity, the present disclosure is not limited thereto. In some embodiments, oxygen may be used. An $O_2$ gas or an $N_2O$ gas may be used as an oxygen source.

Figure 10:
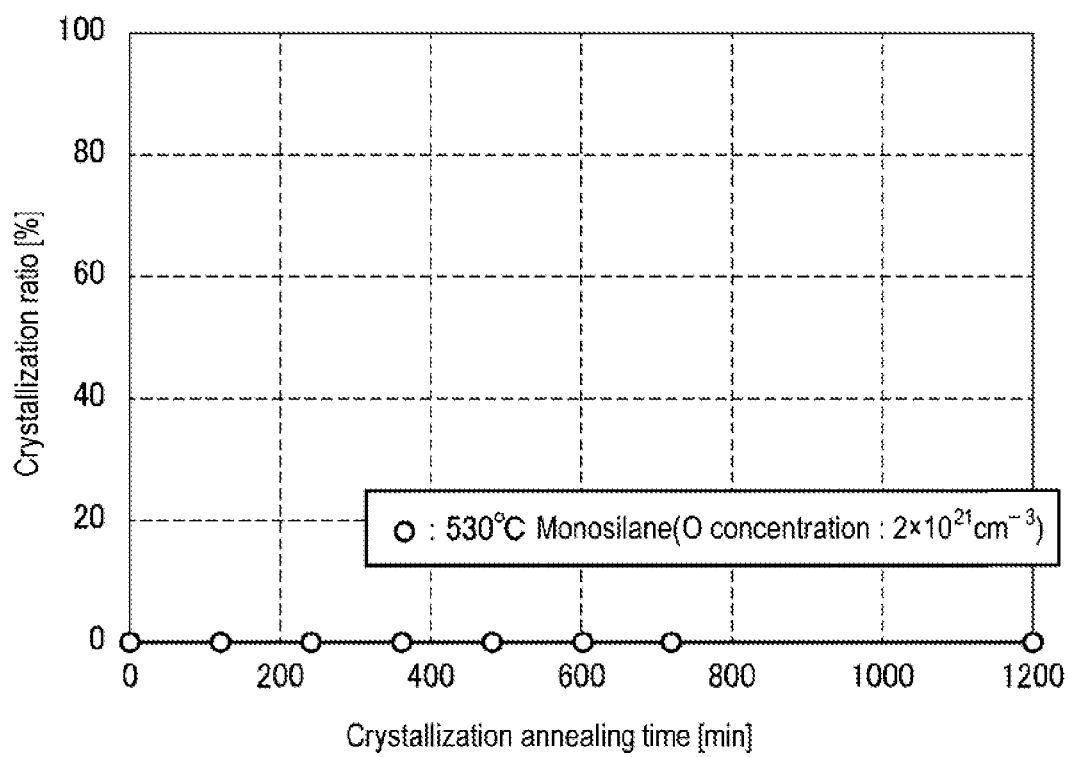
FIG. 10 is a graph showing a relationship between a crystallization annealing time and a crystallization rate in a second modified example.

FIG. 10 is a graph showing a relationship between a crystallization annealing time and a crystallization rate in a second modified example.

As shown in FIG. 10, an investigation has shown that oxygen contained in an oxygen-doped amorphous silicon film having an oxygen concentration of $2 \times 10^{21}$ cm$^{-3}$ have not undergone crystallization even after the crystallization annealing is performed for 1200 min (20 hours).

The oxygen-doped amorphous silicon film having the oxygen concentration of $2 \times 10^{21}$ cm$^{-3}$ may be formed under the following processing conditions:

Flow rate of monosilane: 500 sccm
Flow rate of $N_2O$: 10 sccm
Processing time: 120 sec
Processing temperature: 530 degrees C.
Processing pressure: 53.2 Pa (0.4 Torr)

Under the above conditions, for example, an oxygen-doped amorphous silicon film having a thickness of about 3 nm is formed on a silicon oxide film.

Therefore, the oxygen-doped amorphous silicon film can also be used as the amorphous silicon film doped with the crystallization-suppressing impurity. In some embodiments, nitrogen may be used as the crystallization-suppressing impurity. In this case, an $NH_3$ gas and the like may be used as a nitrogen source.

Third Modified Example

While in the first embodiment and the first and second modified examples, the gas containing the crystallization-suppressing impurity and the silicon raw material gas has been described to be supplied into the processing chamber such that the amorphous silicon film doped with the crystallization-suppressing impurity is formed, the present disclosure is not limited thereto. In some embodiments, the amorphous silicon film doped with the crystallization-suppressing impurity may be formed by supplying another silicon raw material gas containing the crystallization-suppressing impurity into the processing chamber.

For example, in a case where carbon is used as the crystallization-suppressing impurity, a silicon raw material gas including an organic silicon compound may be used as the another silicon raw material gas. In this case, for example, referring to FIGS. 2A to 2C, the carbon-doped amorphous silicon film 2 is formed using the other silicon raw material gas including the organic silicon compound, and the non-doped amorphous silicon film 3 is formed using a silicon raw material gas excluding the organic silicon compound.

Second Embodiment

<Film Forming Apparatus>

Next, an example of a film forming apparatus capable of performing the crystallized silicon film forming method according to the first embodiments of the present disclosure, will be described as a second embodiment.

Figure 11:
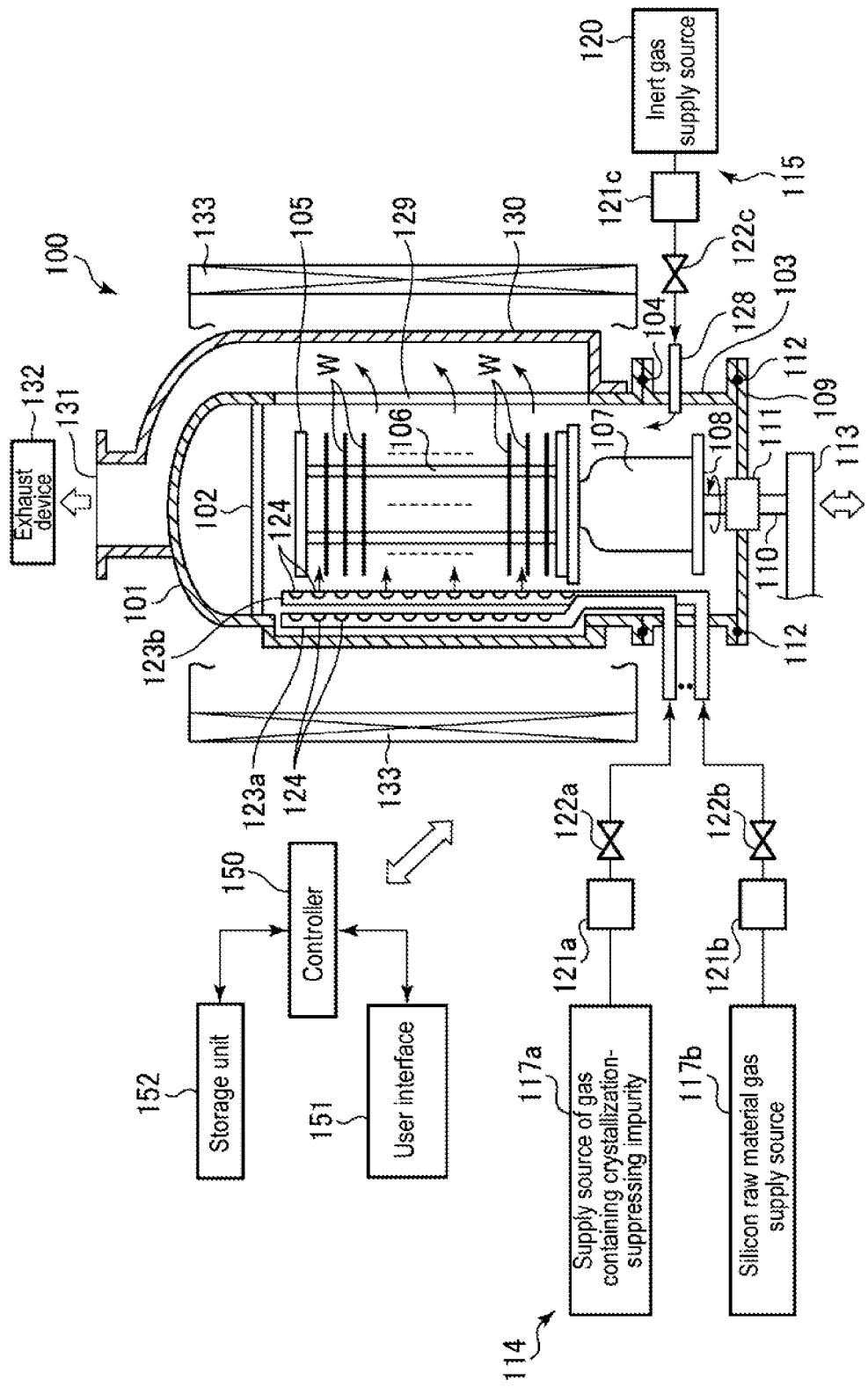
FIG. 11 is a schematic vertical sectional view showing an example of a film forming apparatus according to a second embodiment of the present disclosure.

FIG. 11 is a schematic vertical sectional view showing an example of a batch-type film forming apparatus 100 according to the second embodiment of the present disclosure.

As shown in FIG. 11, the film forming apparatus 100 includes a cylindrical processing chamber 101 having a ceiling with a lower end opened. The entirety of the processing chamber 101 is formed of, e.g., quartz. A quartz ceiling plate 102 is installed at the ceiling inside the processing chamber 101. A cylindrical manifold 103 formed of, e.g., stainless steel, is connected to a lower end opening portion of the processing chamber 101 through a sealing member 104 such as an O-ring.

The manifold 103 supports a lower end portion of the processing chamber 101. A vertical wafer boat 105 is inserted into the processing chamber 101 through a lower portion of the manifold 103. The vertical wafer boat 105 includes a plurality of rods 106 having a plurality of support recesses (not shown) formed therein. A plurality of (e.g., 50 to 100) semiconductor substrates (in this embodiment, silicon wafers W) as objects to be processed is supported by the support recesses. In this embodiment, portions of respective peripheries of the silicon wafers W are supported by the support recesses. With this configuration, in the vertical wafer boat 105, the silicon wafers W are loaded in multiple-stages.

The vertical wafer boat 105 is mounted on a table 108 through a quartz heat insulation tube 107. The table 108 is supported on a rotary shaft 110 that pierces a cover 109 that is formed of, e.g., a stainless steel, to open/close a bottom opening of the manifold 103. For example, a magnetic fluid seal 111 is installed at a piercing portion of the rotary shaft 110 to seal the rotary shaft 110 tightly and support the rotary shaft 110 rotatably. A seal member 112 formed of, for example, an O ring, is installed between a peripheral portion of the cover 109 and a bottom end of the manifold 103. Accordingly, the sealing state in the processing chamber 101 is maintained. The rotary shaft 110 is installed at a front end of an arm 113 supported by an elevating mechanism (not shown) such as a boat elevator. Thus, the wafer boat 105, the cover 109 and the like are elevated in an integrated manner to be inserted into/separated from the processing chamber 101.

The film forming apparatus 100 includes a process gas supply mechanism 114 configured to supply a process gas into the processing chamber 101, and an inert gas supply mechanism 115 configured to supply an inert gas into the processing chamber 101.

In this embodiment, the process gas supply mechanism 114 includes a gas supply source 117a configured to supply a gas containing a crystallization-suppressing impurity, and a silicon raw material gas supply source 117b. In addition, the inert gas supply mechanism 115 includes an inert gas supply source 120. An example of the gas containing the crystallization-suppressing impurity may be ethylene. An example of the silicone raw material gas may be monosilane. An example of the inert gas may be argon.

The gas supply source 117a is coupled to a dispersion nozzle 123a via a flow rate controller 121a and an on-off valve 122a. Similarly, the silicon raw material gas supply source 117b is coupled to a dispersion nozzle 123b via a flow rate controller 121b and an on-off valve 122b.

Each of the dispersion nozzles 123a and 123b includes a quartz pipe, pierces a side wall of the manifold 103 inward, bends upward, and extends vertically. At a vertical portion of each of the dispersion nozzles 123a and 123b, a plurality of gas discharge holes 124 is formed spaced apart from one another by a predetermined distance. Thus, each gas is approximately uniformly discharged from the respective gas discharge holes 124 into the processing chamber 101 in a horizontal direction.

The inert gas supply source 120 is coupled to a nozzle 128 via a flow rate controller 121c and an on-off valve 122c. The nozzle 128 penetrates the sidewall of the manifold 103 and discharges an inert gas into the processing chamber 101 through a leading end thereof in a horizontal direction.

At a portion opposite to the dispersion nozzles 123a and 123b in the processing chamber 101, an exhaust vent 129 is formed to exhaust the processing chamber 101. The exhaust vent 129 has an elongated shape formed by vertically chipping the side wall of the processing chamber 101. At a portion corresponding to the exhaust vent 129 of the processing chamber 101, an exhaust vent cover member 130 with a C-shaped section is installed by welding to cover the exhaust vent 129. The exhaust vent cover member 130 extends upward along the side wall of the processing chamber 101, and defines a gas outlet 131 at the top of the processing chamber 101. An exhaust mechanism 132 including a vacuum pump, or the like is connected to the gas outlet 131. The exhaust mechanism 132 exhausts the processing chamber 101 to discharge the process gas and to change an internal pressure of the processing chamber 101 into a process pressure.

A cylindrical body-shaped heating device 133 is installed on the outer periphery of the processing chamber 101. The heating device 133 activates a gas supplied into the processing chamber 101, and heats the objects to be processed (the silicon wafers W in this embodiment) accommodated within the processing chamber 101.

For example, the components of the film forming apparatus 100 are controlled by a controller 150 including a microprocessor (e.g., a computer). The controller 150 is connected to a user interface 151 including a keyboard for inputting, by an operator, a command to control the film forming apparatus 100, and a display unit for visually displaying an operation state of the film forming apparatus 100.

A memory unit 152 is connected to the controller 150. The memory unit 152 stores a control program for executing various processes in the film forming apparatus 100 under the control of the controller 150, and a program (i.e., a recipe) for executing a process in each component of the film forming apparatus 100 according to the process conditions. For example, the recipe is stored in a memory medium of the memory unit 152. The memory medium may include a hard disk, a semiconductor memory, a CD-ROM, a DVD, and a portable memory such as a flash memory. The recipe may be suitably transmitted from other devices through a dedicated line. If necessary, the recipe is read from the memory unit 152 in response to a command received from the user interface 151, and the controller 150 executes a process according to the read recipe. Accordingly, the film forming apparatus 100 performs a desired process under the control of the controller 150.

In this embodiment, the process gas supply device 114, the inert gas supply device 115, the exhaust device 132, the heating unit 133 and the like are controlled by the controller 150 such that the crystallized silicon film forming method according to the first embodiment is implemented.

The second embodiment of the present disclosure can be embodied using the film forming apparatus 100 as shown in FIG. 11.

Although the present disclosure has been described according to some embodiments, the present disclosure is not limited thereto. A variety of modifications may be made without departing from the spirit of the disclosures.

In the above embodiments, the specific processing conditions have been described, but are not limited thereto. As an example, the processing conditions may be arbitrarily changed depending on a volume of the processing chamber 101, a crystal growth rate. For example, a practicable range of a flow rate for doping of the crystallization-suppressing impurity is as follows:

For carbon: $C_2H_4$, a flow rate ranging from 1 sccm to 50 sccm

For oxygen: $N_2O$ or $O_2$, a flow rate ranging from 1 sccm to 50 sccm

For nitrogen: $NH_3$, a flow rate ranging from 0.5 sccm to 25 sccm

Further, while in the above embodiments, the film forming process has been described to be performed using the batch-type film forming apparatus 100, a single-sheet type film forming apparatus may be used therefor.

According to the present disclosure, it is possible to provide an amorphous silicon crystallizing method and a crystallized silicon film forming method, which are capable of obtaining single crystalline regions having large grain size without degrading productivity, a semiconductor device manufacturing apparatus using the film forming method, and a film forming apparatus configured to perform the film forming method.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of forming a crystallized silicon film by crystallization of amorphous silicones, comprising:

supplying a silicon raw material gas including an organic silicon compound onto a surface to be processed of an object to be processed;

supplying another silicon raw material gas excluding the organic silicon compound onto the surface to be processed; and performing a crystallization treatment on amorphous silicon films formed on the surface to be processed to crystallize amorphous silicones contained in the amorphous silicon films.

2. A method of forming a crystallized silicon film by crystallization of amorphous silicones, comprising:

supplying a silicon raw material gas and a gas containing an impurity for suppressing the crystallization of the amorphous silicones onto a surface to be processed of an object to be processed;

after supplying the silicon raw material gas and the gas containing the impurity, supplying only the silicon raw material gas onto the surface to be processed; and after supplying only the silicon raw material gas, performing a crystallization treatment on amorphous silicon films formed on the surface to be processed to crystallize the amorphous silicones contained in the amorphous silicon films.

3. The method of claim 2, wherein the impurity includes at least one of carbon, oxygen, and nitrogen.

4. The method of claim 2, wherein an insulating material is exposed from the surface to be processed.

5. The method of claim 4, wherein the insulating material includes a silicon oxide.

6. The method of claim 2, wherein processing temperatures in supplying a silicon raw material gas and supplying another silicon raw material gas are the same.

7. A method of manufacturing a semiconductor device using a crystallized silicon film obtained by crystallization of amorphous silicones, the method comprising:

forming the crystallized silicon film using the crystallized silicon film forming method of claim 2.

8. The method of claim 7, further comprising: crystallizing other amorphous silicones using a thermal history obtained in a subsequent manufacturing process performed after the amorphous silicones are crystallized.

* * * * *